United States Patent
Wang et al.

(10) Patent No.: US 8,566,666 B2
(45) Date of Patent: Oct. 22, 2013

(54) MIN-SUM BASED NON-BINARY LDPC DECODER

(75) Inventors: Chung-Li Wang, San Jose, CA (US);
Zongwang Li, San Jose, CA (US);
Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 287 days.

(21) Appl. No.: 13/180,495

(22) Filed: Jul. 11, 2011

(65) Prior Publication Data

US 2013/0019141 A1      Jan. 17, 2013

(51) Int. Cl.
*H03M 13/00* (2006.01)
*H03M 13/11* (2006.01)

(52) U.S. Cl.
CPC .................................. *H03M 13/1148* (2013.01)
USPC ............................. 714/758; 714/746; 714/752

(58) Field of Classification Search
USPC ....................................................... 714/758
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,701,314 A | 12/1997 | Armstrong | |
| 5,710,784 A | 1/1998 | Kindred | |
| 5,712,861 A | 1/1998 | Inoue | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |

(Continued)

OTHER PUBLICATIONS

Lin et al., "Efficient Decoder Design for Nonbinary Quasicyclic LDPC Codes", IEEE Transactions on Circuits and Systems-I: Regular Papers, vol. 57, No. 5, pp. 1071-1082 (May 2010).*

(Continued)

*Primary Examiner* — Cynthia Britt
*Assistant Examiner* — Colin Baird
(74) *Attorney, Agent, or Firm* — Hamilton DeSanctis & Cha

(57) ABSTRACT

Various embodiments of the present invention provide systems and methods for min-sum based decoding of non-binary LDPC codes. For example, a non-binary low density parity check data decoding system is discussed that includes a variable node processor and a check node processor. The variable node processor is operable to generate variable node to check node message vectors and to calculate perceived values based on check node to variable node message vectors. The check node processor is operable to generate the check node to variable node message vectors and to calculate checksums based on variable node to check node message vectors. The check node processor includes a minimum and subminimum finder circuit operable to process a plurality of sub-messages in each variable node to check node message vector. The check node processor also includes a select and combine circuit operable to combine an output of the minimum and subminimum finder circuit to generate the check node to variable node message vectors.

24 Claims, 7 Drawing Sheets

(56) References Cited

U.S. PATENT DOCUMENTS

| | | | |
|---|---|---|---|
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,438,717 B1 | 8/2002 | Butler | |
| 6,473,878 B1 | 10/2002 | Wei | |
| 6,535,553 B1 | 3/2003 | Limberg et al. | |
| 6,625,775 B1 | 9/2003 | Kim | |
| 6,657,803 B1 | 12/2003 | Ling et al. | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson et al. | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song et al. | |
| 7,073,118 B2 | 7/2006 | Greenberg et al. | |
| 7,093,179 B2 | 8/2006 | Shea | |
| 7,117,427 B2 | 10/2006 | Ophir et al. | |
| 7,133,228 B2 | 11/2006 | Fung | |
| 7,136,244 B1 | 11/2006 | Rothberg et al. | |
| 7,184,486 B1 | 2/2007 | Wu | |
| 7,191,378 B2 | 3/2007 | Eroz et al. | |
| 7,203,887 B2 | 4/2007 | Eroz et al. | |
| 7,308,061 B1 | 12/2007 | Huang | |
| 7,310,768 B2 | 12/2007 | Eidson et al. | |
| 7,313,750 B1 | 12/2007 | Feng | |
| 7,370,258 B2 | 5/2008 | Iancu et al. | |
| 7,415,651 B2 | 8/2008 | Argon | |
| 7,500,172 B2* | 3/2009 | Shen et al. | 714/780 |
| 7,502,189 B2 | 3/2009 | Sawaguchi et al. | |
| 7,516,388 B2* | 4/2009 | Matsumoto | 714/752 |
| 7,523,375 B2 | 4/2009 | Spencer | |
| 7,530,002 B2* | 5/2009 | Lee et al. | 714/758 |
| 7,587,657 B2 | 9/2009 | Haratsch | |
| 7,590,168 B2 | 9/2009 | Raghavan et al. | |
| 7,646,829 B2 | 1/2010 | Ashley et al. | |
| 7,702,986 B2 | 4/2010 | Bjerke et al. | |
| 7,730,384 B2 | 6/2010 | Graef et al. | |
| 7,738,201 B2 | 6/2010 | Jin et al. | |
| 7,752,523 B1 | 7/2010 | Chaichanavong et al. | |
| 7,779,325 B2 | 8/2010 | Song | |
| 7,802,172 B2 | 9/2010 | Vila Casado et al. | |
| 7,952,824 B2 | 5/2011 | Dziak et al. | |
| 7,958,425 B2 | 6/2011 | Chugg et al. | |
| 7,996,746 B2 | 8/2011 | Livshitz et al. | |
| 8,010,869 B2* | 8/2011 | Wehn et al. | 714/758 |
| 8,018,360 B2 | 9/2011 | Nayak | |
| 8,051,355 B2* | 11/2011 | Taubin et al. | 714/752 |
| 8,185,807 B2* | 5/2012 | Oh et al. | 714/781 |
| 8,201,051 B2 | 6/2012 | Tan et al. | |
| 8,237,597 B2 | 8/2012 | Liu et al. | |
| 8,250,431 B2* | 8/2012 | Yang et al. | 714/755 |
| 8,261,171 B2 | 9/2012 | Annampedu | |
| 8,291,284 B2 | 10/2012 | Savin | |
| 8,295,001 B2 | 10/2012 | Liu et al. | |
| 8,458,553 B2* | 6/2013 | Zhong et al. | 714/752 |
| 2004/0186992 A1 | 9/2004 | Matsumoto | 713/161 |
| 2005/0229091 A1 | 10/2005 | Narayanan et al. | 714/801 |
| 2007/0011565 A1* | 1/2007 | Kim et al. | 714/758 |
| 2007/0113163 A1* | 5/2007 | Golitschek Edler Von Elbwart et al. | 714/801 |
| 2008/0069373 A1 | 3/2008 | Jiang | |
| 2008/0172592 A1* | 7/2008 | Wehn et al. | 714/758 |
| 2008/0304558 A1 | 12/2008 | Zhu et al. | |
| 2008/0320362 A1* | 12/2008 | Taubin et al. | 714/755 |
| 2009/0063931 A1* | 3/2009 | Rovini et al. | 714/758 |
| 2009/0132893 A1 | 5/2009 | Miyazaki | |
| 2009/0185643 A1 | 7/2009 | Fitzpatrick | |
| 2011/0029837 A1* | 2/2011 | Yang et al. | 714/758 |
| 2011/0029839 A1* | 2/2011 | Zhong et al. | 714/763 |
| 2011/0167227 A1 | 7/2011 | Yang | |
| 2011/0242691 A1* | 10/2011 | Burger et al. | 360/31 |
| 2011/0246856 A1* | 10/2011 | Jin et al. | 714/763 |
| 2011/0264917 A1 | 10/2011 | Li | |
| 2012/0124118 A1 | 5/2012 | Ivkovic | |
| 2012/0182643 A1 | 7/2012 | Zhang | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Xie et al., "A Sorting-based Architecture of Finding the First Two Minimum Values for LDPC Decoding", IEEE 7th International Colloquium on Signal Processing and its Application, pp. 95-98, (2011).*

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Declercq, "Decoding Algorithms for Nonbinary LDPC Codes over GF(q)", IEEE Trans. on Commun., vol. 55(4), pp. 633-643 (Apr. 2007).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kang et al., "A Two-Stage Iterative Decoding of LDPC Codes for Lowering Error Floors", IEEE Globecom Proceedings, 1088-1091 (2008).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

(56) References Cited

OTHER PUBLICATIONS

Lin et al "An efficient Vlsi Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Olmos et al., "Tree-Structure Expectation Propagation for LDPC Decoding in Erasure Channels", Cornell University Library arXiv:1009.4287 (Sep. 22, 2010).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systems—1: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/171,615, Unpublished (filed Jun. 29, 2011) (Bradley D. Seago).

U.S. Appl. No. 13/174,453, Unpublished (filed Jun. 30, 2011) (Johnson Yen).

U.S. Appl. No. 13/167,764, Unpublished (filed Jun. 24, 2011) (Zongwang Li).

U.S. Appl. No. 13/113,219, Unpublished (filed May 23, 2011) (Yang Han).

U.S. Appl. No. 13/174,537, Unpublished (filed Jun. 30, 2011) (Anantha Raman Krishnan).

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.

Wymeersch et al., "Log-Domain Decoding of LDPC Codes Over GF(q)", IEEE Int. Conf. on Commun., vol. 2, pp. 772-776 (Jun. 2004).

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhao, "Joint Detection/Decoding Algorithms for Nonbinary LDPC Codes over ISI Channels" [online] [ret. on Nov. 9, 2012] Ret. From Internet: http://arxiv.org/abs/1209.2542v1.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. on Circuits, Regular Papers, vol. 5, No. 4, pp. 766-775, Apr. 2005.

* cited by examiner

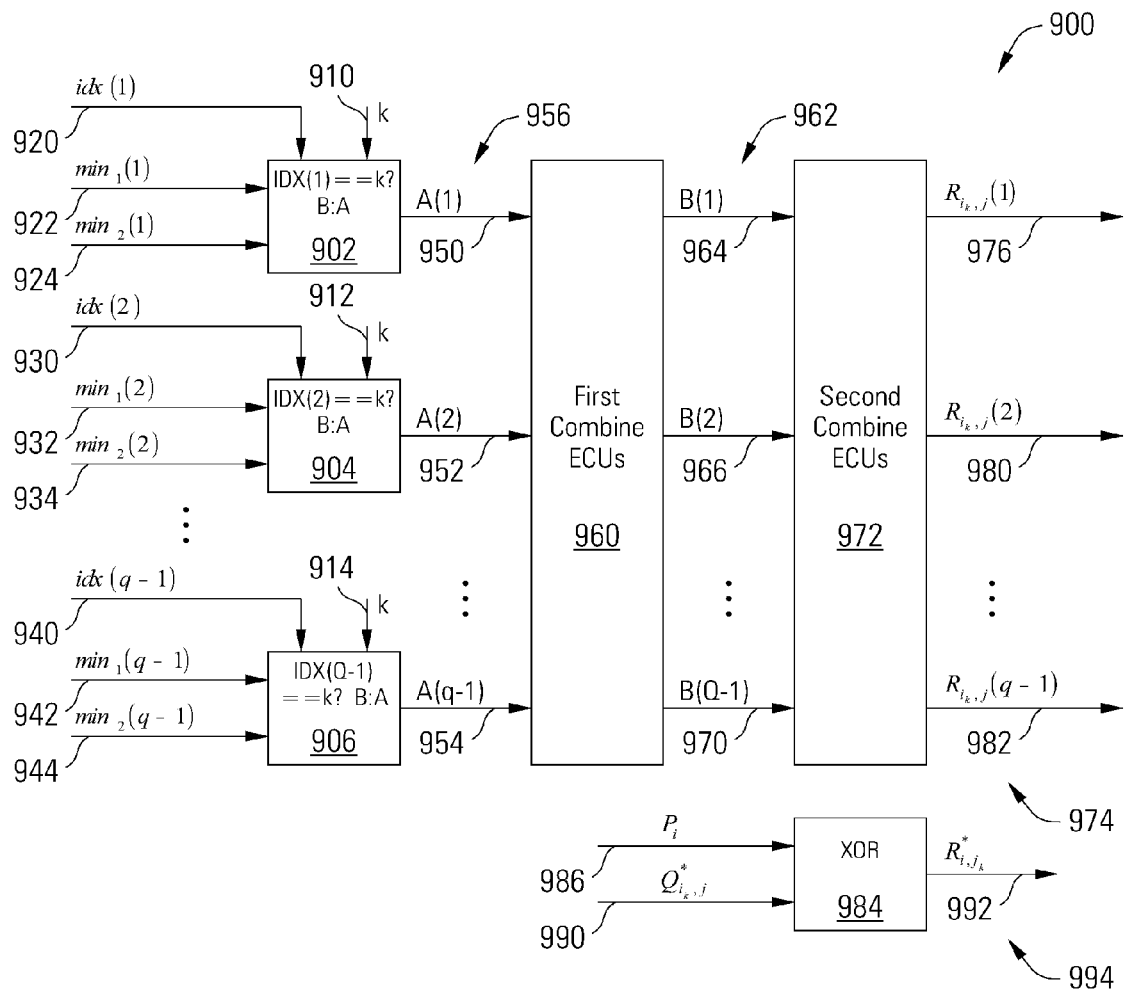
FIG. 9
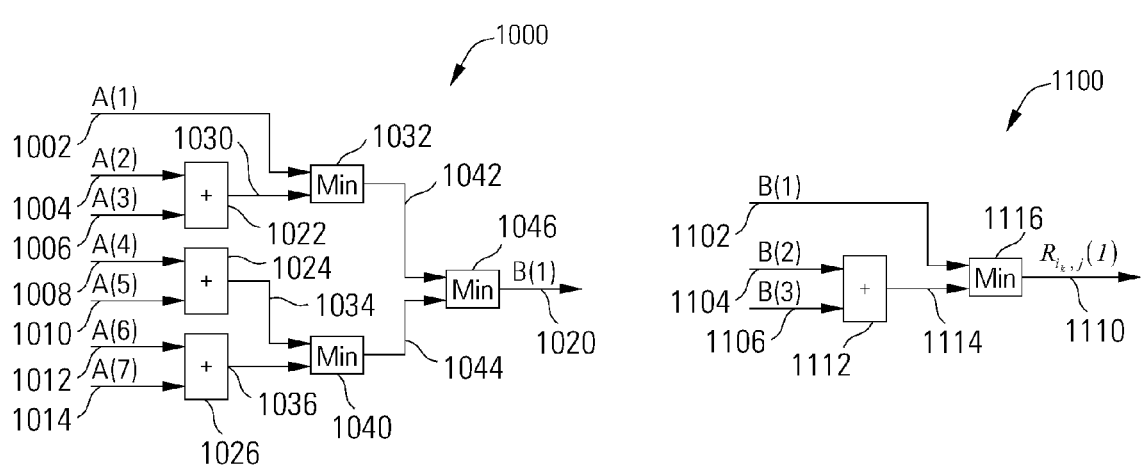
FIG. 10
FIG. 11

MIN-SUM BASED NON-BINARY LDPC DECODER

BACKGROUND

Various embodiments of the present invention are related to systems and methods for decoding data, and more particularly to systems and methods for min-sum based decoding of non-binary low density parity check (LDPC) codes.

Digital information storage and transmission has become ubiquitous in practically every facet of life throughout most of the world. Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

BRIEF SUMMARY

Various embodiments of the present invention are related to systems and methods for decoding data, and more particularly to systems and methods for min-sum based decoding of non-binary low density parity check (LDPC) codes.

Various embodiments of the present invention provide systems and methods for min-sum based decoding of non-binary LDPC codes. For example, a non-binary low density parity check data decoding system is discussed that includes a variable node processor and a check node processor. The variable node processor is operable to generate variable node to check node message vectors and to calculate perceived values based on check node to variable node message vectors. The check node processor is operable to generate the check node to variable node message vectors and to calculate checksums based on variable node to check node message vectors. The check node processor includes a minimum and subminimum finder circuit operable to process a plurality of sub-messages in each extrinsic variable node to check node message vector. The check node processor also includes a select and combine circuit operable to combine an output of the minimum and subminimum finder circuit to generate the check node to variable node message vectors. Some embodiments of the system also include a format conversion circuit and a format recovery circuit operable to convert variable node to check node message vectors from a first format to a second format, and check node to variable node message vectors from the second format to the first format. In these embodiments, the first format includes an LLR indicating a likelihood of a symbol being each of the elements in a Galois Field, and the second format includes an indication of which of the elements in the Galois Field the symbol is most likely to be, and an LLR value for each of the other elements in the Galois Field, normalized to the LLR value of the most likely element. Some embodiments of the system include an edge interleaver operable to interleave the variable node to check node message vectors, and an edge de-interleaver operable to de-interleave the check node to variable node message vectors. In various embodiments of the system, the minimum and subminimum finder circuit is operable to identify a minimum log likelihood ratio, an index of the minimum log likelihood ratio, and a sub-minimum log likelihood ratio for each of the elements of the Galois Field from each of the extrinsic variable node to check node message vectors. In various embodiments of the system, the check node processor also includes a hard decision and parity check circuit operable to recursively calculate a parity check and hard decision for each of the plurality of extrinsic variable node to check node message vectors. In various embodiments of the system, the select and combine circuit includes an update table generator, and the select and combine circuit is operable to combine the output of the minimum and subminimum finder circuit to generate the check node to variable node message vectors based at least in part on an output of the update table generator.

Other embodiments of the present invention provide a method for decoding non-binary low density parity check encoded data. A variable node to check node message vector is generated in a variable node processor based at least in part on extrinsic check node to variable node message vectors. A check sum and hard decision is calculated in a check node processor in a check node processor based at least in part on extrinsic variable node to check node message vectors. A minimum, index of minimum and sub-minimum value is calculated in the check node processor for each element in a Galois Field from each of the extrinsic variable node to check node message vectors. A check node to variable node message vector is generated in the check node processor by combining the minimum, index of minimum and sub-minimum values. Some embodiments of the method also include converting the variable node to check node message vector from a first format to a second format, and converting the check node to variable node message vector from the second format to the first format. The first format includes an LLR value indicating a likelihood of a symbol being each of the elements in the Galois Field. The second format includes an indication of which element in the Galois Field the symbol is most likely to be, and an LLR value for each of the other elements in the Galois Field, normalized to the LLR of the most likely element. Some embodiments of the method also include interleaving variable node to check node message vectors and de-interleaving check node to variable node message vectors.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 9 depicts a select and combine circuit suitable for use in a check node processor in a min-sum based non-binary LDPC decoder in accordance with various embodiments of the present invention;

FIG. 10 depicts a first combine elementary computation unit suitable for use in a select and combine circuit in a check node processor in a min-sum based non-binary LDPC decoder in accordance with various embodiments of the present invention;

FIG. 11 depicts a second combine elementary computation unit suitable for use in a select and combine circuit in a check node processor in a min-sum based non-binary LDPC decoder in accordance with various embodiments of the present invention;

DETAILED DESCRIPTION OF THE INVENTION

Various embodiments of the present invention are related to systems and methods for decoding data, and more particularly to systems and methods for min-sum based decoding of non-binary low density parity check (LDPC) codes. In a conventional non-binary min-sum LDPC decoder with GF(q) and with p check node rows in the parity check matrix, check node processing involves both forward and backward recursions that incur long latency since they require about $q^2$ additions and comparisons in each of p−2 basic steps. To perform both forward and backward recursions, numerous intermediate messages are stored, requiring a large memory, and messages are sorted when combining the results of forward and backward recursions. In contrast, the min-sum based decoding of non-binary LDPC codes disclosed herein provides low-complexity decoding that does not require forward and backward recursions, sorting or dynamic programming. By including message normalization and modification of the search space, searching over various local configurations is reduced to the simple recursive processing of a single message vector.

Figure 1:
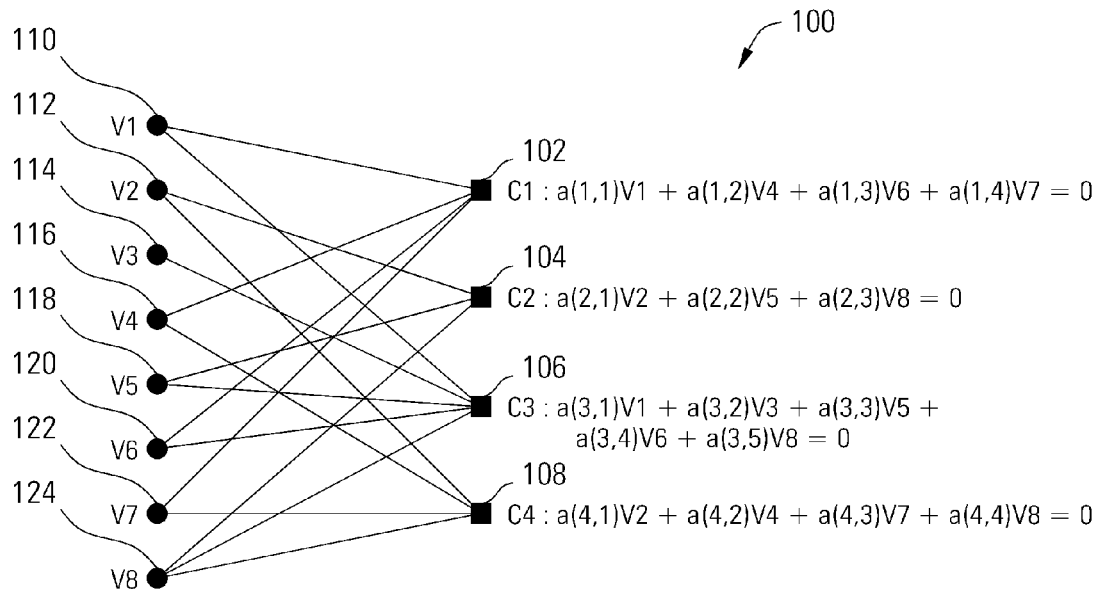
FIG. 1 depicts a Tanner graph of an example prior art LDPC code.

Check nodes (or check node processors) in a min-sum based non-binary LDPC decoder receive incoming messages from connected or neighboring variable nodes and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message for each neighboring variable node.

Both V2C and C2V messages are vectors, each including a number of sub-messages with LLR values. Each V2C message vector from a particular variable node will contain sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field. Message normalization in the simplified min-sum decoding is performed with respect to the most likely symbol. Thus, the V2C and C2V vector format includes two parts, an identification of the most likely symbol and the LLR for the other q−1 symbols, since the most likely symbol has LLR equal to 0 after normalization.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, also referred to as simplified min-sum decoding, the check nodes calculate the minimum sub-message $min_1(d)$, the index $idx(d)$ of $min_1(d)$, and the sub-minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, $idx(d)$ and $min_2(d)$ is calculated based on the gathered sub-messages for that symbol d. For a Galois Field with q symbols, the check node will calculate the $min_1$), $idx(d)$ and $min_2(d)$ sub-message for each of the q−1 non-zero symbols in the field except the most likely symbol. The $min_1(d)$, $idx(d)$ and $min_2(d)$ values are stored in a memory for use in calculating the C2V message, requiring much less memory than the traditional non-binary LDPC check node processor that stores each intermediate forward and backward message.

These and other aspects of the simplified min-sum decoding disclosed herein both reduce latency and circuit area and complexity in a decoder for non-binary LDPC codes.

Figure 2A:
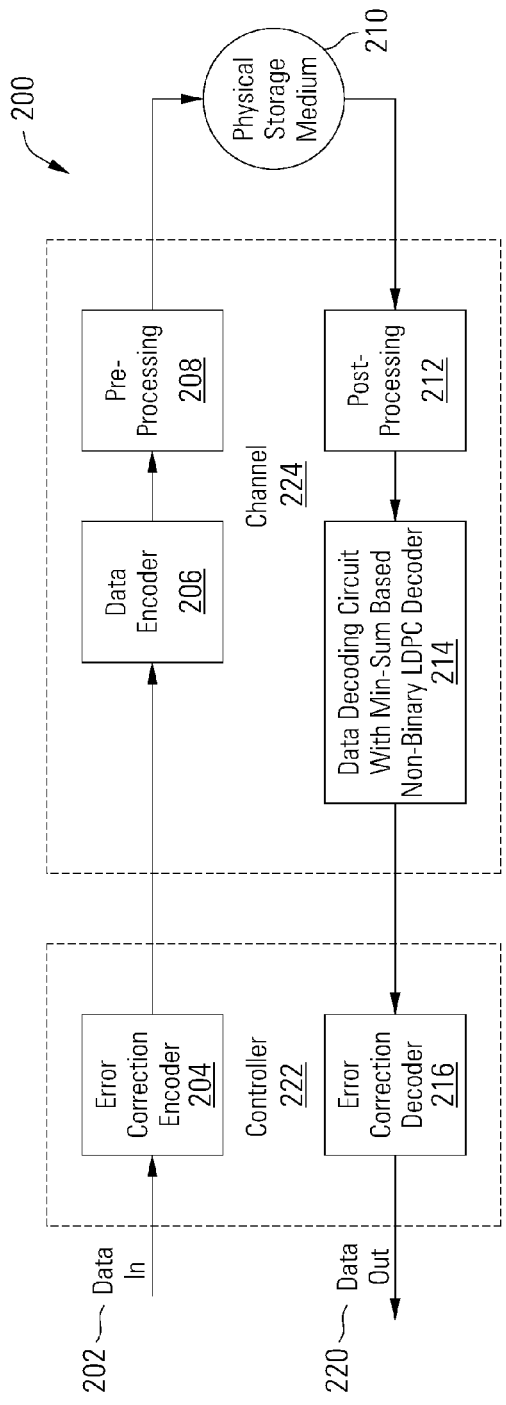
FIG. 2A depicts an example data storage system using a data decoder with a min-sum based non-binary LDPC decoder in accordance with some embodiments of the present invention.

Although the min-sum based non-binary LDPC decoder disclosed herein is not limited to any particular application, several examples of applications are presented herein that benefit from embodiments of the present invention. Turning to FIG. 2A, a storage system 200 including a data decoding circuit 214 with a min-sum based non-binary LDPC decoder is shown in accordance with some embodiments of the present invention. Storage system 200 includes a controller 222, a channel 224, and a physical storage medium 210. Physical storage medium 210 may be, but is not limited to, a magnetic disk. Based on the disclosure provided herein, one of ordinary skill in the art will recognize a variety of physical storage media that may be used in relation to different embodiments of the present invention. Controller 222 includes error correction encoding and decoding. In particular, controller 222 includes an error correction encoder 204. Error correction encoder 204 may be any error correction encoder known in the art including, but not limited to, a Reed Solomon encoder or a CRC encoder, and error correction decoder 216 may be, but is not limited to, a corresponding Reed Solomon decoder or CRC decoder. Both the aforementioned encoder and decoder may be any circuit or system known in the art that is capable of performing encoding and decoding processes. Channel 224 includes a data encoder 206 and a pre-processing circuit 208. In some cases, data encoder 206 is an LDPC encoder. Based on the disclosure provided herein, one of ordinary skill in the art will recognize a variety of encoding processes and corresponding decoding processes that may be implemented in accordance with different embodiments of the present invention. Pre-processing circuit 208 includes the various pre-processing circuitry that is well known in the art. Post-processing circuit 212 includes the various post-processing circuitry that is well known in the art for receiving data from a physical storage medium and for preparing the received data for data detection and decoding.

During operation of the storage system 200, a data input 202 is received. Data input 202 may be any data set destined for storage on physical storage medium 210. Data input 202 is encoded using error correction encoder 204 as is known in the art. The output of error correction encoder 204 is provided to data encoder 206 that may, for example, perform an LDPC encoding of the data. The output of data encoder 206 is provided to pre-processing circuit 208 that may convert the output from a digital output to an analog output satisfactory for writing to physical storage medium 210.

The data previously written to physical storage medium 210 may be subsequently retrieved and processed by post-processing circuit 212. In one case, post-processing circuit 212 performs an amplification of an analog data signal retrieved from physical storage medium 210, and converts the amplified analog signal to a digital signal that is output to data decoding circuit 214. In turn, data decoding circuit 214 performs a variable number of data detection and data decoding processes until either the output of the processes converges (i.e., it adequately represents the original data encoded by data encoder 206) or until insufficient resources remain to perform additional processing. Data decoding circuit 214 provides its result as an output to error correction decoder 216. Error correction decoder 216 performs the designated error correction processing to determine whether any errors remain and if detected, attempts to correct the errors. Once the error correction processes are completed, error correction decoder 216 provides a data output 220. In general, data output 220 corresponds to data input 202 that was originally provided for writing to physical storage medium 210.

The data decoding circuit 214 includes a min-sum based non-binary LDPC decoder capable of decoding data with low latency and with reduced memory requirements when compared with conventional non-binary LDPC decoders.

Figure 2B:
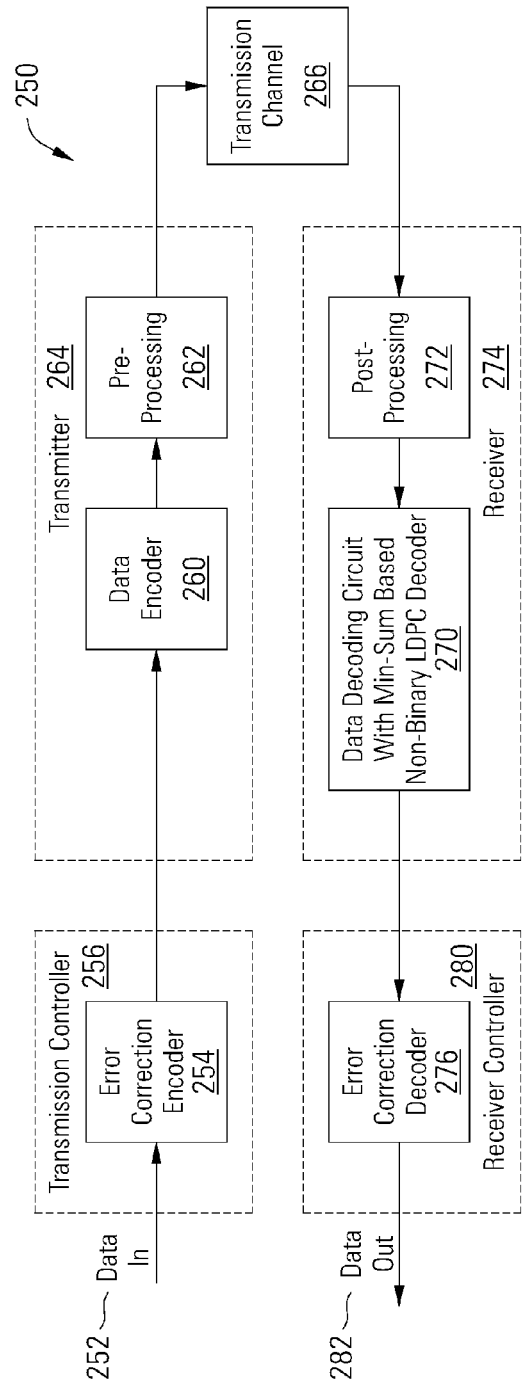
FIG. 2B depicts an example data transfer system using a data decoder with a min-sum based non-binary LDPC decoder in accordance with some embodiments of the present invention.

Turning to FIG. 2B, a transmission system 250 including a data decoding circuit 270 with a min-sum based non-binary LDPC decoder is depicted in accordance with some embodiments of the present invention. Transmission system 250 includes a transmission controller 256, a transmitter 264, a transmission channel 266, a receiver 274, and a receiver controller 280. Transmission channel may be, but is not limited to, an RF transmission channel. Based on the disclosure provided herein, one of ordinary skill in the art will recognize a variety of transmission channels that may be used in relation to different embodiments of the present invention. Transmission controller 256 includes an error correction encoder 254 that may be implemented, for example, as a Reed Solomon encoder or a CRC encoder. Similarly, receiver controller 280 includes an error correction decoder 276 corresponding to error correction encoder 254. Thus, error correction decoder 276 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 264 includes a data encoder 260 and a pre-processing circuit 262. In some cases, data encoder 260 is an LDPC encoder. Based on the disclosure provided herein, one of ordinary skill in the art will recognize a variety of encoding processes that may be implemented in accordance with different embodiments of the present invention. Pre-processing circuit 262 includes the various pre-processing circuitry that is well known in the art. In one particular case, pre-processing circuit 262 is operable to convert a digital data set from data encoder 260 to a corresponding RF signal suitable for transmission via transmission channel 266. The data set transferred via transmission channel 266 is received using a post-processing circuit 272 of receiver 274. Post-processing circuit 272 includes the various post-processing circuitry that is well known in the art for receiving data from a transmission channel and for preparing the received data for data detection and decoding.

In operation, a data input 252 is received. Data input 252 may be any data set destined for transmission via transmission channel 266. Data input 252 is encoded using error correction encoder 254 as is known in the art. The output of error correction encoder 254 is provided to data encoder 260 that may, for example, perform an LDPC encoding of the data. The output of data encoder 260 is provided to pre-processing circuit 262 that may convert the output from a digital output to an analog output satisfactory for transmission via transmission channel 266.

The data transmitted via transmission channel 266 is received and processed by post-processing circuit 272 of receiver 274. In one case, post-processing circuit 272 performs an amplification of an analog data signal retrieved from transmission channel 266, and converts the amplified analog signal to a digital signal that is output to data decoding circuit 270. In turn, data decoding circuit 270 performs a variable number of data detection and data decoding processes until either the output of the processes converges (i.e., it adequately represents the original data encoded by data encoder 260) or until insufficient resources remain to perform additional processing. Data decoding circuit 270 provides its result as an output to error correction decoder 276. Error correction decoder 276 performs the designated error correction processing to determine whether any errors remain and if detected, attempts to correct the errors. Once the error correction processes are completed, error correction decoder 276 provides a data output 282. In general, data output 282 corresponds to data input 252 that was originally provided for transmission via transmission channel 266.

As in the storage system 200 of FIG. 2B, the data decoding circuit 270 of transmission system 250 includes a min-sum based non-binary LDPC decoder capable of decoding data with low latency and with reduced memory requirements when compared with conventional non-binary LDPC decoders.

It should be noted that while FIGS. 2A and 2B depict a storage system and a transmission system in which a min-sum based non-binary LDPC decoder may be applied, there are a variety of systems in which a min-sum based non-binary LDPC decoder in accordance with different embodiments of the present invention may be applied. Based on the disclosure provided herein, one of ordinary skill in the art will recognize a variety of systems that may be benefited by use of a min-sum based non-binary LDPC decoder in accordance with different embodiments of the present invention.

Figure 3:
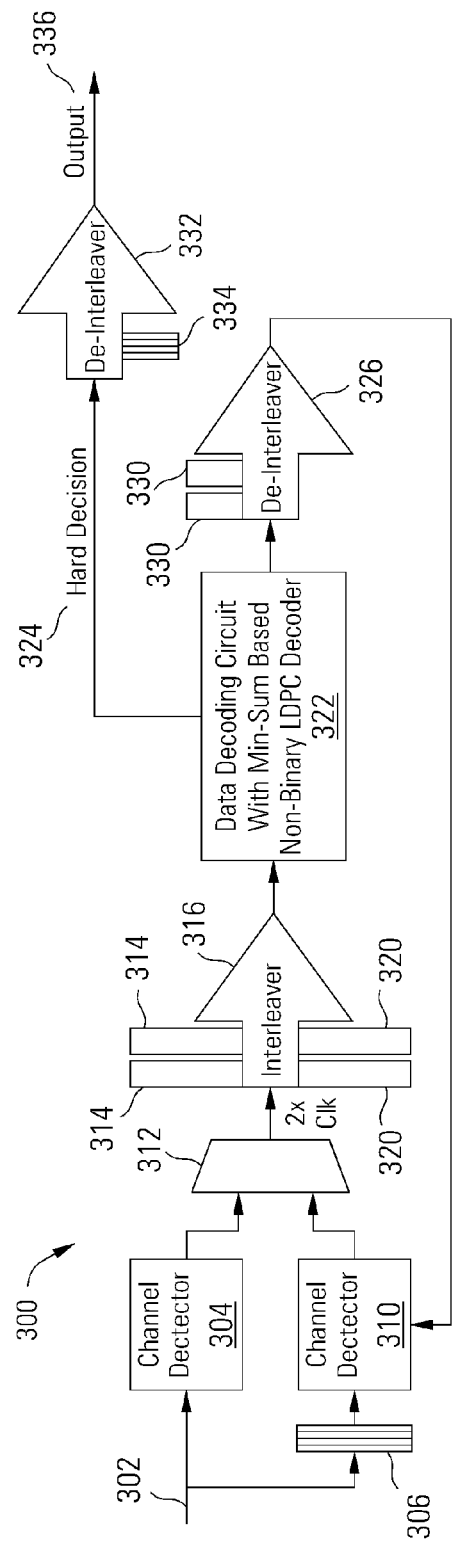
FIG. 3 depicts a data detection and decoding circuit with a min-sum based non-binary LDPC decoder in accordance with various embodiments of the present invention.

Turning to FIG. 3, one implementation of a data decoding circuit 300 that may include a min-sum based non-binary LDPC decoder 322 and that may be used in place of the data decoding circuit 214 and data decoding circuit 270 of FIGS. 2A and 2B is depicted in accordance with some embodiments of the present invention. Data decoding circuit 300 includes a data input 302 that is fed to a channel detector 304. Channel detector 304 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 302 is provided to an input data buffer 306 that is designed to hold a number of data sets received from data input 302. The size of input data buffer 306 may be selected to provide sufficient buffering such that a data set input via data input 302 remains available at least until a first iteration processing of that same data set is complete and the processed data is available in a ping pong buffer 330 (i.e., a queuing buffer) as more fully described below. Input data buffer 306 provides the data sets to a channel detector 310. Similar to channel detector 304, channel detector 310 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 304 and channel detector 310 are provided to an interleaver circuit 316 via a multiplexer 312. Such outputs may be, for example, log likelihood ratio values. Interleaver circuit 316 interleaves the output of channel detector 304 and separately interleaves the output of channel detector 310 using two ping pong buffers 314, 320. One of the buffers in ping pong buffer 314 holds the result of a prior interleaving process of the output from channel detector 304 and is unloaded to min-sum based non-binary LDPC decoder 322, while the other buffer of ping pong buffer 314 holds a data set from channel detector 304 that is currently being interleaved. Similarly, one of the buffers in ping pong buffer 320 holds the result of a prior interleaving process of the output from channel detector 310 and is unloaded to min-sum based non-binary LDPC decoder 322, while the other buffer of ping pong buffer 320 holds a data set from channel detector 310 that is currently being interleaved.

In normal operation, a first data set is introduced via data input 302 to channel detector 304. Channel detector 304 performs its channel detection algorithm and provides both a hard output and a soft output to multiplexer 312. The hard and soft decision data is written to one buffer of ping pong buffer 314. At the same time the detector output is written into the buffer, interleaver 316 interleaves the data set by writing consecutive data into non-consecutive memory/buffer addresses based on the interleaver algorithm/mapping. Once interleaver 316 completes its interleaving process, the interleaved data is decoded by min-sum based non-binary LDPC decoder 322. Where the data converges, min-sum based non-binary LDPC decoder 322 writes its output as hard decision output 324 to output data buffer 334 and the processing is completed for that particular data set. Alternatively, where the data does not converge, min-sum based non-binary LDPC decoder 322 writes its output (both soft and hard) to ping pong buffer 330.

The data written to ping pong buffer 330 is fed back to channel detector 310. Channel detector 310 selects the data set that corresponds to the output in ping pong buffer 330 from input data buffer 306 and performs a subsequent data detection aided by the soft output data generated by min-sum based non-binary LDPC decoder 322 fed back from ping pong buffer 330. By using the previously generated soft data for data maintained in input data buffer 306, channel detector 310 generally performs a subsequent channel detection with heightened accuracy. The output of this subsequent channel detection is passed to interleaver 316 via multiplexer 312. The data is written to one buffer of ping pong buffer 320, and interleaver 316 interleaves the data. The interleaved data is then passed to min-sum based non-binary LDPC decoder 322 where it is decoded a second time. Similar to the first iteration, a decision is made as to whether the data converged or whether there is insufficient space in ping pong buffer 330 to handle the data. Where such is the case, min-sum based non-binary LDPC decoder 322 writes its output as hard decision output 324 to output data buffer 334 and the processing is complete for that particular data set. Alternatively, where the data does not converge and there is sufficient buffer space in ping pong buffer 330 to receive an additional data set, min-sum based non-binary LDPC decoder 322 writes its output (both soft and hard) to ping pong buffer 330 where it is passed back to channel detector 310 for a third pass. Sufficient space is defined in ping pong buffer 330 by having at least reserved space for the data set from the first detector and decoder iteration after the data set from the second detector and decoder iteration is written into the ping pong buffer 330.

It should be noted that, as an example, a first data set may be applied at data input 302 and that it takes a number of iterations to converge while all subsequent data sets applied at data input 302 converge on the first pass (i.e., on a single iteration). In such a case, the first data set may be processed a number of times (i.e., a number of global iterations) that is limited by the amount of memory available in output data buffer 334. Once output data buffer 334 is full or once an ordered set of outputs are available, the most recent hard decision output corresponding to the first data set is provided as a hard decision output and de-interleaver 334 re-orders the outputs putting the first output in the first position. With this done, output data buffer 334 is flushed out as output 336.

Figure 4:
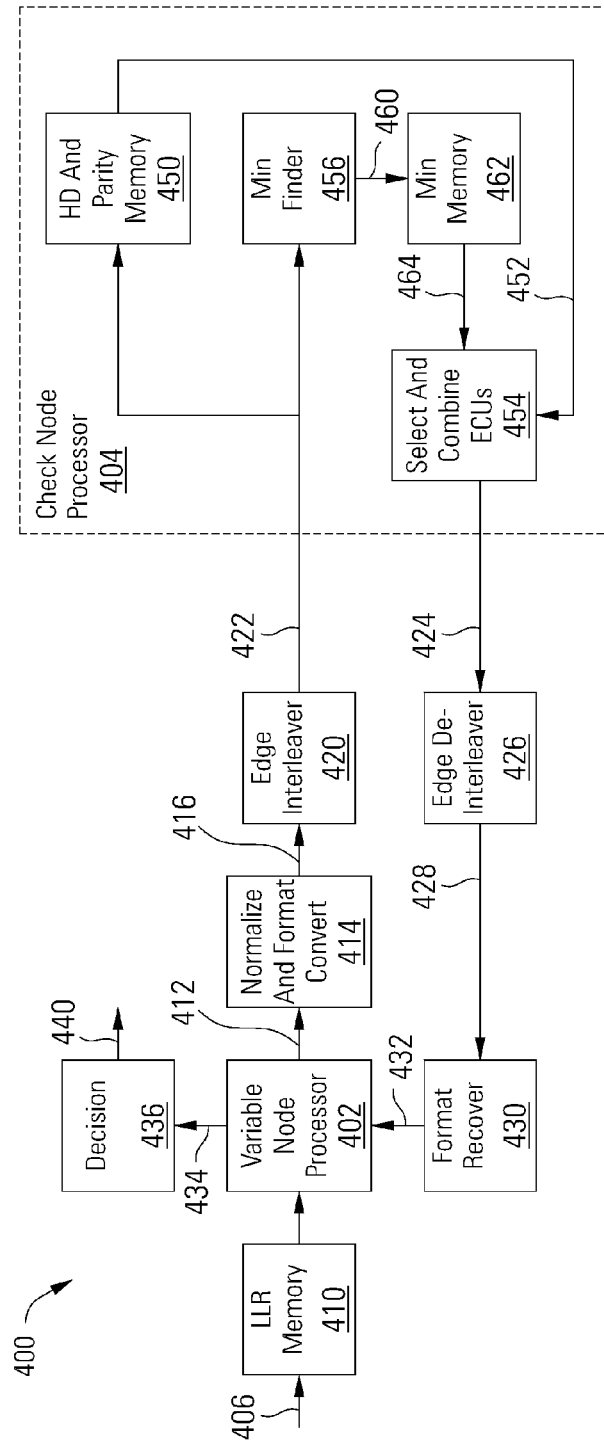
FIG. 4 depicts a block diagram of a min-sum based non-binary LDPC decoder in accordance with various embodiments of the present invention.

Turning to FIG. 4, a block diagram of a portion of a min-sum based non-binary LDPC decoder 400 is illustrated. The block diagram of FIG. 4 illustrates the processing flow between variable node processor 402 and check node processor 404. Multiple variable nodes and check nodes may be implemented in a single variable node processor 402 and check node processor 404 as in FIG. 4. In other embodiments, multiple variable node processors and check node processors may be included, for example having the number of variable node processors and check node processors corresponding directly to the number of variable nodes and check nodes in the Tanner Graph. While the full circuit topology showing the interconnections between processing units implementing the multiple variable nodes and check nodes is not shown, the min-sum based non-binary LDPC decoder 400 is not limited to any particular topology and may be adapted to meet the requirements of any number of specific applications. Based on the disclosure provided herein, one of ordinary skill in the art will recognize a variety of LDPC circuits that may be adapted to min-sum based non-binary LDPC decoding, both currently known and that may be developed in the future.

The min-sum based non-binary LDPC decoder 400 is provided with LLR values from an input channel 406, which may be stored in an LLR memory 410. As discussed above, in other embodiments, plain-likelihood probability values are used rather than log-likelihood-ratio values. The values are provided to the variable node processor 402, which updates the perceived value of the symbol corresponding with the variable node processor 402 based on the value from input channel 406 and on C2V message vectors from neighboring check node processors (e.g., 404). The variable node processor 402 also generates V2C message vectors 412 for neighboring check node processors (e.g., 404). The V2C message vectors 412 are provided to a message format converter 414 which converts the format of V2C message vectors 412 to a format consisting of two parts, the most likely symbol, and the LLR of other symbols, normalized to the most likely symbol, yielding normalized V2C message vectors 416 in the second format. The normalized V2C message vectors 416 are provided to an edge interleaver 420 which shuffles messages on the boundaries at message edges, randomizing noise and breaking dependencies between messages. The interleaved normalized V2C message vectors 422 are provided to the check node processor 404, which generates C2V messages 424 for each neighboring variable node processor based on extrinsic V2C messages from other neighboring variable node processors.

The C2V messages 424 are provided to an edge de-interleaver 426, which reverses the process of the edge interleaver 420, and then to a format recovery circuit 430, which converts message vectors from the second, normalized format to the first message vector format of the variable node processor 402, reversing the process of the message format converter 414. The resulting first format C2V messages 432 are provided to the variable node processor 402 for use in updating perceived LLR values in variable nodes. In other embodiments, the variable node processor 402 is adapted to operate directly with message vectors of the second, normalized format. In these embodiments, the message format converter 414 and format recovery circuit 430 are omitted.

When the values in the min-sum based non-binary LDPC decoder 400 converge and stabilize, or when a limit is reached on the number of local iterations, the variable node processor 402 provides the total LLR $S_n(a)$ 434 to a decision circuit 436 to generate a hard decision 440 based on the $\text{argmin}_a$ of the total LLR $S_n(a)$.

The check node processor 404 includes a hard decision and parity memory circuit 450 that processes the interleaved normalized V2C message vectors 422 to provide the most likely symbol 452 to a select and combine circuit 454 having a number of elementary computation units (ECUs). The check node processor 404 also includes a min finder 456 that calculates the $\min_1(d)$, $\text{idx}(d)$ and $\min_2(d)$ sub-messages 460 for each of the q symbols in the Galois Field and stores them in a min memory 462. The stored $\min_1(d)$, $\text{idx}(d)$ and $\min_2(d)$ sub-messages 464 are provided by min memory 462 to the select and combine circuit 454. The select and combine circuit 454 combines the $\min_1(d)$, $\text{idx}(d)$ and $\min_2(d)$ sub-messages 464 and the most likely symbol 452 to generate the C2V messages 424.

The check node processor 404 may be adapted to decode non-binary LDPC codes having a variety of different codes, code lengths, and Galois Fields. A regular non-binary LDPC code C is given by the null space of a sparse m×n parity-check matrix H over GF(q). The check node processor 404 may be adapted to decode both regular and irregular LDPC codes. In a regular LDPC code, each column of H has γ non-zero entries, or weight γ, and each row has ρ non-zero entries, or weight ρ, where γ and ρ are small compared to the code length. In an irregular LDPC code, the columns and/or rows of parity check matrix H have variable weights, $\rho_i$ for the i-th row and $\gamma_j$ for the j-th column. Again, columns of H represent variable nodes, and rows represent check nodes. For an m×n parity-check matrix H, variable nodes may be labeled from 0 to n−1 and check nodes may be labeled from 0 to m−1. The j-th variable node and i-th check node are connected by an edge if $h_{i,j} \neq 0$. The variable nodes connected to the i-th check node, denoted by $N_i$, correspond to the code symbols that are included in the i-th checksum. The number of variable nodes in N, is referred to as the degree of the i-th checksum. The check nodes connected to the j-th variable node, denoted as $M_j$, correspond to the checksums that include the j-th variable node. The number of check nodes in $M_j$ is referred to as the degree of the j-th variable node. $N_i(k)$ is defined to be the k-th variable node included in the i-th checksum, and $M_j(k)$ is defined to be the j-th check node including the i-th variable node.

The perceived LLR values $L_j(a)$ are known at the variable nodes implemented in variable node processor 402, either stored in an external LLR memory 410 or by computing them on the fly from measurements at the input channel 406. The perceived LLR values $L_j(a)$ are calculated using Equation 1:

$$L_j(a) = \ln Pr(x_j = s_j | \text{channel}) - \ln Pr(x_j = a | \text{channel}) \quad \text{Equation 1}$$

where $x_j$ is the code symbol based on the measured value a from the channel and $s_j$ is the most likely Galois Field symbol of the code symbol $x_j$, calculated for the j-th check node.

In order to avoid probability multiplications and divisions, the log-probability or log-likelihood ratio (LLR) is used such that each element in the Galois Field has its own value. The variable node processor 402 calculates the sum of LLR values over all incoming C2V message vectors $R'_{i,j} = [R'_{i,j}(0) \ldots R'_{i,j}(q-1)]$ for each element in the C2V message vectors. The variable node processor 402 then produces the V2C message vectors 412 $Q'_{i,j} = [Q'_{i,j}(0) \ldots Q'_{i,j}(q-1)]$ to each neighboring check node by subtracting the LLR value from that check node from the LLR sum, and permuting the vector entries according to finite field multiplication by $h_{i,j}$. This vector format formed by q LLR values is referred to herein as the first format or Format I. The V2C message vectors 412 are calculated in the variable node processor 402 according to Equations 2 and 3:

$$S_j(a) = L_j(a) + \sum_{k=1}^{\gamma_j} R'_{i_k,j}(h_{i_k,j}a) \quad \text{Equation 2}$$

where $S_j(a)$ is the LLR sum, $L_j(a)$ is the perceived LLR value in a variable node j, and $$\sum_{k=1}^{\gamma_j} R'_{i_k,j}(h_{i_k,j}a)$$

are the LLR values from all check nodes.

$$Q'_{i_k,j}(h_{i_k,j}a) = S_j(a) - R'_{i_k,j}(h_{i_k,j}a) \quad \text{Equation 3}$$

$R'_{i_k,j}(h_{i_k,j}a)$ is the prior round LLR value from the check node for which the variable node is generating the message.

The message format converter 414 normalizes the LLR values to prevent them from going over the range, normalizing them with respect to the most likely symbol. The normalized V2C message vectors 416 (and similarly, the normalized C2V message vectors 428) are in a second format also referred to herein as Format II, which includes two parts, the most likely symbol and the LLR of other symbols, since the most likely symbol has LLR equal to 0 after normalization. These Format II LLR values are expressed as $Q_{i,j} = [Q^*_{i,j}(0), Q_{i,j}(1) \ldots Q_{i,j}(q-1)]$ in normalized V2C message vectors 416 and as $R_{i,j} = [R_{i,j}(0), R_{i,j}(1) \ldots R_{i,j}(q-1)]$ in normalized C2V message vectors 428, where $Q^*_{i,j}(0)$ and $R^*_{i,j}(0)$ are the most likely symbols, and where $Q_{i,j}(1) \ldots Q_{i,j}(q-1)$ and $R_{i,j}(1) \ldots R_{i,j}(q-1)$ are the LLR values of the remaining q−1 elements of the Galois Field, normalized to the most likely symbols $Q^*_{i,j}(0)$ and $R^*_{i,j}(0)$, respectively. Notably, the normalization of messages not only changes LLR values but also changes LLR orders, from the absolute order to a relative order with respect to the most likely symbol. Thus $Q'_{i,j}(a)$ and $S_{i,j}(a)$ are in the absolute order of $a \in GF(q)$. Format II LLR values $Q_{i,j}(d)$ and $R_{i,j}(d)$ are in the relative order of $d \in GF(q) \backslash 0$, with the most likely symbols $Q_{i,j}^*$ and $R_{i,j}^*$ respectively.

Figure 5:
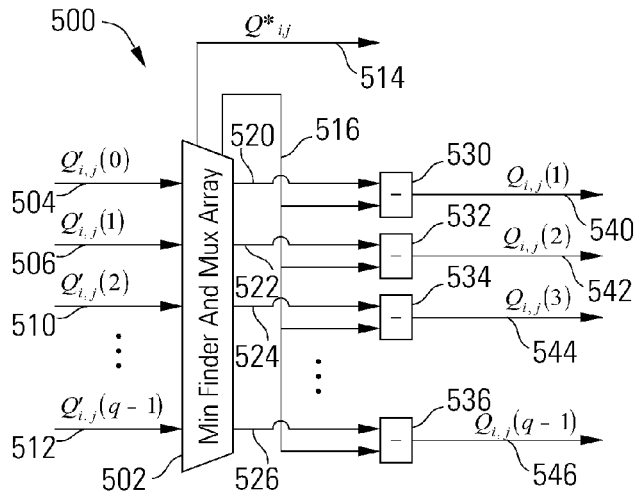
FIG. 5 depicts a message format converter suitable for use in a min-sum based non-binary LDPC decoder in accordance with various embodiments of the present invention.

An example of a message format converter 500 is illustrated in FIG. 5 that is suitable for use in place of the message format converter 414 of FIG. 4. A min finder and mux array 502 is operable to process message $Q'_{i,j}$ to yield $Q^*_{i,j}(0)$ and $Q_{i,j}(1) \ldots Q_{i,j}(q-1)$, used to form $Q_{i,j}=[Q^*_{i,j}(0), Q_{i,j}(1) \ldots Q_{i,j}(q-1)]$ in normalized V2C message vectors 416. The min finder and mux array 502 identifies the minimum of input sub-messages in message $Q'_{i,j}(Q'_{i,j}(0))$ 504, $Q'_{i,j}(1)$ 506, $Q'_{i,j}(2)$ 510 ... $Q'_{i,j}(q-1)$ 512). The min finder and mux array 502 outputs the most likely symbol $Q^*_{i,j}$ 514, where $Q^*_{i,j}=\text{argmin}_a Q'_{i,j}(a)$, and where $a \in GF(q)$. $Q^*_{i,j}$ is thus the argument of the minimum sub-message, where $\text{Min}=Q'_{i,j}(Q^*_{i,j})$. The multiplexers in the min finder and mux array 502 also output the LLR value 516 of the most likely symbol Q 514, and the LLR values 520, 522, 524, 526 of the remaining q-1 symbols in the Galois Field. The LLR values 520, 522, 524, 526 are normalized to the LLR value 516 of the most likely symbol $Q^*_{i,j}$ 514 by subtracting the most likely symbol $Q^*_{i,j}$ 514 from each in subtracters 530, 532, 534, 536 to yield the normalized LLR values $Q_{i,j}(1)$ 540, $Q_{i,j}(2)$ 542, $Q_{i,j}(3)$ 544, $Q_{i,j}(q-1)$ 546 of symbols in the Galois Field other than the most likely symbol $Q^*_{i,j}$ 514, according to Equations 4 and 5:

$$Q^*_{i,j} = \arg\min_{a \in GF(q)} Q'_{i,j}(a) \qquad \text{Equation 4}$$

$$Q_{i,j}(d) = Q'_{i,j}(d + Q^*_{i,j}) - Q'_{i,j}(Q^*_{i,j}) \qquad \text{Equation 5}$$

Figure 6:
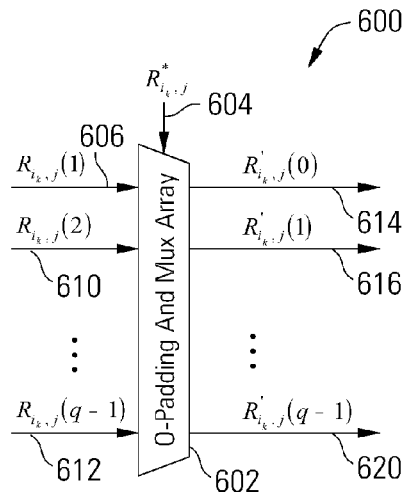
FIG. 6 depicts a format recovery circuit suitable for use in a min-sum based non-binary LDPC decoder in accordance with various embodiments of the present invention.

Turning back to FIG. 4, the message vector format conversion from Format I to Format II performed by message format converter 414 on V2C message vectors 412 is reversed by format recovery circuit 430, providing C2V messages 432 to variable node processor 402 in Format I. An example of a format recovery circuit 600 is illustrated in FIG. 6 that is suitable for use in place of the format recovery circuit 430 of FIG. 4. A 0-padding and mux array 602 processes the most likely symbol $R_{i_k,j}^*$ 604 (also referred to herein as $R^*_{i,j}(0)$) and the remaining q-1 normalized LLR values $R_{i_k,j}(1)$ 606, $R_{i_k,j}(2)$ 610 ... $R_{i_k,j}(q-1)$ 612, yielding sub-messages $R'_{i_k,j}(0)$ 614, $R_{i_k,j}(1)$ 616 ... $R_{i_k,j}(q-1)$ 620 for C2V messages 432. The 0-padding and mux array 602 generates the sub-messages of C2V messages 432 according to Equations 6 and 7, changing the order of the sub-messages and zero-padding the C2V messages 432 by setting sub-message $R'_{i_k,j}(R_{i_k,j}^*)$ to 0:

$$R'_{i_k,j}(d+R_{i_k,j}^*)=R_{i_k,j}(d) \qquad \text{Equation 6}$$

$$R'_{i_k,j}(R_{i_k,j}^*)=0 \qquad \text{Equation 7}$$

Figure 7:
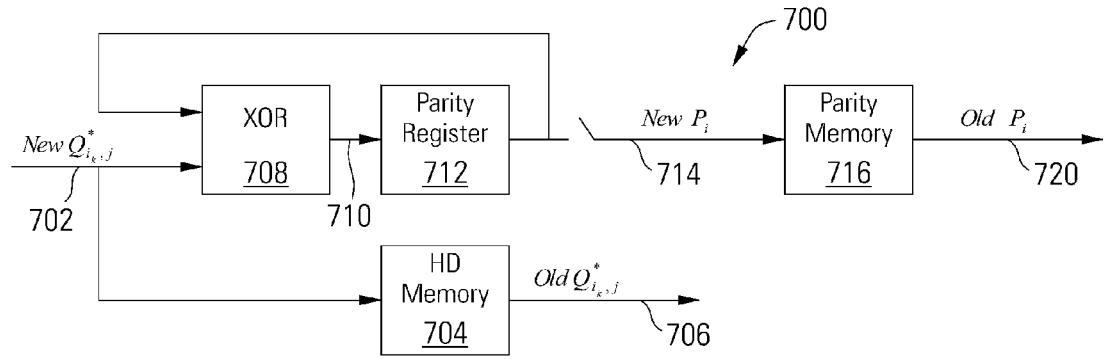
FIG. 7 depicts a hard decision and parity memory circuit suitable for use in a check node processor in a min-sum based non-binary LDPC decoder in accordance with various embodiments of the present invention.

Turning to FIG. 7, an example of a hard decision and parity memory circuit 700 is illustrated that is suitable for use as the hard decision and parity memory circuit 450 of FIG. 4. The hard decision and parity memory circuit 700 processes the symbol portion of each message vector from each neighboring variable node. Each of the most likely symbols $Q_{i_k,j}$ 702 in the interleaved normalized V2C message vectors 422 is provided to a hard decision memory 704, storing each one and yielding stored most likely symbols $Q_{i_k,j}^*$ 706. Each of the most likely symbols $Q_{i_k,j}^*$ 702 is also provided to an XOR circuit 708, where they are recursively XORed together. The intermediate results 710 are stored in a parity register 712 to be XORed with the next of the most likely symbols $Q_{i_k,j}^*$ 702 until the symbols from each neighboring variable node have been combined. The resulting parity symbol $P_i$ 714 is stored in a parity memory 716 which yields stored parity symbols $P_i$ 720. The hard decision and parity memory circuit 700 thus calculates the checksum for $k=1 \ldots \rho_i$ according to Equation 8. The hard decision and parity memory circuit 700 or another circuit in the min-sum based non-binary LDPC decoder 400 may also be adapted to calculate the hard decision $R_{i,j_k}^*$ according to Equation 9:

$$P_i = \sum_{k=1}^{\rho_i} Q^*_{i,j_k} \qquad \text{Equation 8}$$

$$R^*_{i,j_k} = P_i + Q^*_{i,j_k} \qquad \text{Equation 9}$$

Figure 8:
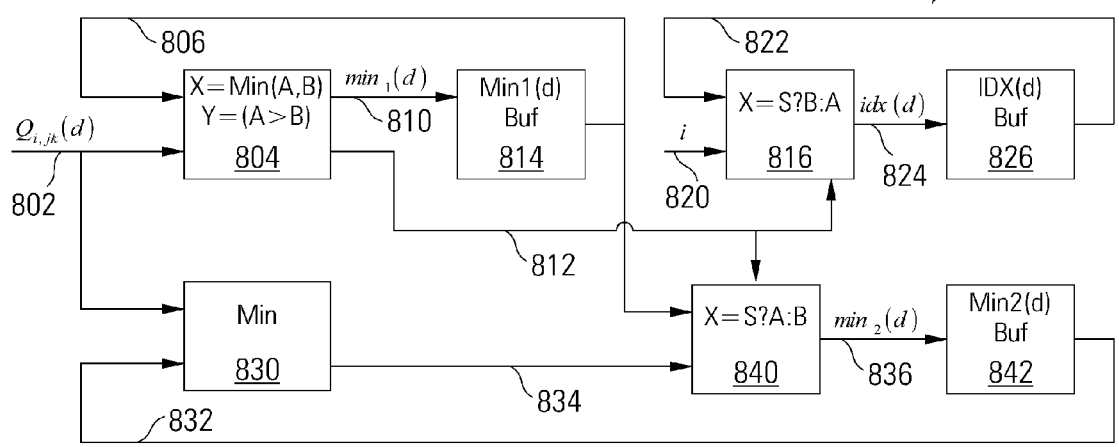
FIG. 8 depicts a min finder circuit suitable for use in a check node processor in a min-sum based non-binary LDPC decoder in accordance with various embodiments of the present invention.

Turning to FIG. 8, an example of a min finder 800 is illustrated that is suitable for use as the min finder 456 of FIG. 4. The min finder 800 calculates the $\min_1(d)$, $\text{idx}(d)$ and $\min_2(d)$ sub-messages 460 for each of the q symbols in the Galois Field, based on the sub-messages $Q_{i,jk}(d)$ 802 in the message vectors from each neighboring variable node. As with the hard decision and parity memory circuit 700, the min finder 800 recursively scans through each message vector from each neighboring variable node, in this case processing the LLR values of symbols other than the most likely symbol in the message vectors. The sub-messages $Q_{i,jk}(d)$ 802 are provided to a comparison circuit 804 that compares two inputs, the latest sub-message $Q_{i,jk}(d)$ 802 and the minimum 806 of the previously received sub-messages $Q_{i,jk}(d)$ 802. The comparison circuit 804 produces the $\min_1(d)$ 810 as the minimum symbol at the two inputs and an indicator signal 812 that indicates when the latest sub-message $Q_{i,jk}(d)$ at input 802 is less than the minimum 806 of the previously received sub-messages $Q_{i,jk}(d)$. The $\min_1(d)$ 810 is stored in a buffer 814 which yields the minimum 806 in subsequent iterations.

The indicator signal 812 is used to generate the $\text{idx}(d)$ 824 by controlling a selector 816 to select either the current value of an incrementing index number i 820 or a previously stored index number 822, such that $\text{idx}(d)$ 824 represents the index number of $\min_1(d)$ 810. The selector 816 yields the $\text{idx}(d)$ 824 which is stored in a buffer 826.

The sub-messages $Q_{i,jk}(d)$ 802 are also provided to a comparison circuit 830 that compares the sub-messages $Q_{i,jk}(d)$ 802 with the previous $\min_2(d)$ value 832, yielding the lesser sub-message 834. Either the lesser sub-message 834 or the stored $\min_1(d)$ 806 is selected as $\min_2(d)$ 836 in selector 840, based on the value of indicator signal 812. The selector 840 is adapted to select the greater of the two inputs when the indicator signal 812 signals that a new minimum sub-message has just been received at the input 802. The $\min_2(d)$ 836 is stored in buffer 842 for use in subsequent iterations.

The operation of the min finder 800 may be described in the following logic statements:

```
if min₁(d) > Q_{i,jk}(d),
    idx(d) = i;
    min₂(d) = min₁(d);
    min₁(d) = Q_{i,jk}(d);
else
    idx(d) = idx(d);
    min₂(d) = min(min₂(d),Q_{i,jk}(d));
```

The min finder 800 calculates $\min_1(d)$ 810, $\min_2(d)$ 836 and $idx(d)$ 824 according to Equations 10, 11 and 12:

$$\min_1(d) = \min_{k=1 \ldots \rho_i} Q_{i,j_k}(d) \qquad \text{Equation 10}$$

$$idx(d) = \arg\min_{k=1 \ldots \rho_i} Q_{i,j_k}(d) \qquad \text{Equation 11}$$

$$\min_2(d) = \min_{k=1 \ldots \rho_i, k \neq idx(d)} Q_{i,j_k}(d) \qquad \text{Equation 12}$$

Turning to FIG. 9, an example of a select and combine circuit 900 is illustrated that is suitable for use as the select and combine circuit 454 of FIG. 4. For values of k from 1 to $\rho_i$ with $j_k=N_i(k)$, the approximation messages are calculated in the select and combine circuit 900, selecting $\min_1(d)$ if $k \neq idx(d)$ and $\min_2(d)$ if $k = idx(d)$ with the goal of avoiding messages from current variable nodes. The selection is performed in a group of q−1 selector circuits 902, 904, 906, controlled by index inputs 910, 912, 914 cycling through the values of k. The first selector circuit 902 has an $idx(1)$ input 920, a $\min_1(1)$ input 922 and a $\min_2(1)$ input 924, the next selector circuit 904 has an $idx(2)$ input 930, a $\min_1(2)$ input 932 and a $\min_2(2)$ input 934, and so on. The q−1'th selector circuit 906 has an $idx(q-1)$ input 940, a $\min_1(q-1)$ input 942 and a $\min_2(q-1)$ input 944. The q−1 selector circuits 902, 904, 906 produce q−1 outputs $A(d)$ 956, including output $A(1)$ 950, output $A(2)$ 952, and so on to output $A(q-1)$ 954. Thus, output $A(d)$ 956 is set to $\min_1(d)$ if $k \neq idx(d)$ and to $\min_2(d)$ if $k = idx(d)$. This selection operation may also be represented by the pseudocode statement select idx==k?B:A, where A and B are minimum and sub-minimum LLR values for a particular Galois Field element (e.g., 922 and 924), idx is the input identifying the variable node that provided the minimum and sub-minimum LLR values (e.g., 920), and k is a variable that cycles through each variable node (e.g., 910).

Intermediate output message $A(d)$ 956 is provided to a first combine ECU circuit 960 which yields q−1 outputs $B(d)$ 962, including output $B(1)$ 964, output $B(2)$ 966, and so on to output $B(q-1)$ 970. Intermediate output message $B(d)$ 962 is provided to a second combine ECU circuit 972 which yields q−1 outputs $R_{i_k,j}(d)$ 974, including output $R_{i_k,j}(1)$ 976, output $R_{i_k,j}(2)$ 980, and so on to output $R_{i_k,j}(q-1)$ 982. The select and combine circuit 900 also includes an XOR circuit 984 that combines the symbol portion of the message vector in a bitwise operation, XORing the parity symbol $P_i$ 986 with the most likely symbol $Q_{i,j}$ 990 to yield hard decision $R_{i,j_k}^*$ 992. Note that XOR circuit 984 implements Equation 9 above, and that this function may be included either in hard decision and parity memory circuit 450 or in select and combine circuit 454 or elsewhere in the min-sum based non-binary LDPC decoder 400. The resulting $R_{i,j_k}^*$ 992 in combination with q−1 LLR values $R_{i_k,j}(d)$ 974 form a C2V message vector 994.

Turning to FIG. 10, an example of a first combine ECU 1000 is illustrated that is suitable for use as a portion of the first combine ECU circuit 960 of FIG. 9. In this example, seven intermediate sub-messages $A(1)$, $A(2)$, $A(3)$, $A(4)$, $A(5)$, $A(6)$ and $A(7)$ 1002, 1004, 1006, 1008, 1010, 1012, 1014 are combined to yield intermediate output sub-message $B(1)$ 1020. Intermediate sub-messages $A(2)$ and $A(3)$ 1004, 1006 are added in adder 1022. Intermediate sub-messages $A(4)$ and $A(5)$ 1008, 1010 are added in adder 1024. Intermediate sub-messages $A(6)$ and $A(7)$ 1012, 1014 are added in adder 1026. Intermediate sub-message $A(1)$ 1002 and the output 1030 of adder 1022 are compared in comparator 1032 which yields the minimum of the inputs. The output 1034 of adder 1024 and the output 1036 of adder 1026 are compared in comparator 1040 which also yields the minimum of the inputs. The output 1042 of comparator 1032 and the output 1044 of comparator 1040 are compared in comparator 1046 which yields intermediate output sub-message $B(1)$ 1020 as the minimum of the inputs 1042, 1044.

Each intermediate output sub-message may be generated with a different first combine ECU circuit. The number of inputs used to generate each output may also be adapted or varied in other embodiments. FIG. 10 illustrates a portion of a first combine ECU circuit that generates a single intermediate output sub-message, and does not illustrate an entire first combine ECU. In general, the first combine ECU circuit 960 performs the calculation of Equation 13:

$$B(d) = \min\left(A(d), \min_{k=1 \ldots num(d)} (A(D(d,k,0)) + A(D(d,k,1)))\right) \qquad \text{Equation 13}$$

where $D(d,k,:)$ is an update table that may be generated by the following pseudo code:

```
for d=1...q−1 \\ initialize
   num(d) = 0;
endfor
for d'=1...q−1
   for d''=(d'+1)...q−1
      d=d'+d''; \\ finite field addition
      D(d,num(d),0)=d';
      D(d,num(d),1)=d'';
      num(d)++;
   endfor
endfor
```

One can show that $num(d)=q/2-1$ after the update table is generated. In some embodiments, the update table is implemented as a wire/switching network, changing with d.

In a more specific example embodiment, a first combine ECU may be adapted to perform the calculations set forth in Equation block 14 to generate all intermediate output sub-messages 962:

$B(1)=\min(A(1),A(2)+A(3),A(4)+A(5),A(6)+A(7))$ $B(2)=\min(A(2),A(1)+A(3),A(4)+A(6),A(5)+A(7))$ $B(3)=\min(A(3),A(1)+A(2),A(4)+A(7),A(5)+A(6))$ $B(4)=\min(A(4),A(1)+A(5),A(2)+A(6),A(3)+A(7))$ $B(5)=\min(A(5),A(1)+A(4),A(2)+A(7),A(3)+A(6))$ $B(6)=\min(A(6),A(1)+A(7),A(2)+A(4),A(3)+A(5))$ $B(7)=\min(A(7),A(1)+A(6),A(2)+A(5),A(3)+A(4))$   Equation 14

Turning to FIG. 11, an example of a second combine ECU 1100 is illustrated that is suitable for use as a portion of the second combine ECU circuit 972 of FIG. 9. In this example, three intermediate sub-messages $B(1)$, $B(2)$, $B(3)$ 1102, 1104, 1106 are combined to yield intermediate output sub-message $C(1)$, or if scaled, output sub-message $R_{i_k,j}(1)$ 1110. Intermediate sub-messages $B(2)$ and $B(3)$ 1104, 1106 are added in adder 1112. Intermediate sub-message $B(1)$ 1102 and the output 1114 of adder 1112 are compared in comparator 1116 which yields intermediate output sub-message $C(1)$, or if scaled, output sub-message $R_{i_k,j}(1)$ 1110, as the minimum of the inputs.

Each intermediate sub-message may be generated with a different second combine ECU circuit. The number of inputs used to generate each output may also be adapted or varied in other embodiments. FIG. 11 illustrates a portion of a first combine ECU circuit that generates a single output sub-message, and does not illustrate an entire second combine ECU. In general, the second combine ECU circuit 972 performs the calculation of Equation 15:

$$C(d) = \min\left(B(d), \min_{k=1\ldots\left(\frac{num(d)-1}{2}\right)}(B(D(d,k,0)) + B(D(d,k,1)))\right)$$ Equation 15

In a more specific example embodiment, a second combine ECU may be adapted to perform the calculations set forth in Equation block 16 to generate all output sub-messages 974:

$C(1)=\min(B(1),B(2)+B(3))$ $C(2)=\min(B(2),B(1)+B(3))$ $C(3)=\min(B(3),B(1)+B(2))$ $C(4)=\min(B(4),B(1)+B(5))$ $C(5)=\min(B(5),B(1)+B(4))$ $C(6)=\min(B(6),B(1)+B(7))$ $C(7)=\min(B(7),B(1)+B(6))$   Equation 16

Intermediate output sub-messages $C(1) \ldots C(7)$ may be scaled with a preset scaling factor $0 \leq c \leq 1$ in comparator 1116 or in another component to yield output sub-messages $R_{i_k,j}(d)$ 974 according to Equation 17:

$R_{i,j_k}(d) = c \cdot C(d)$   Equation 17

Figure 12:
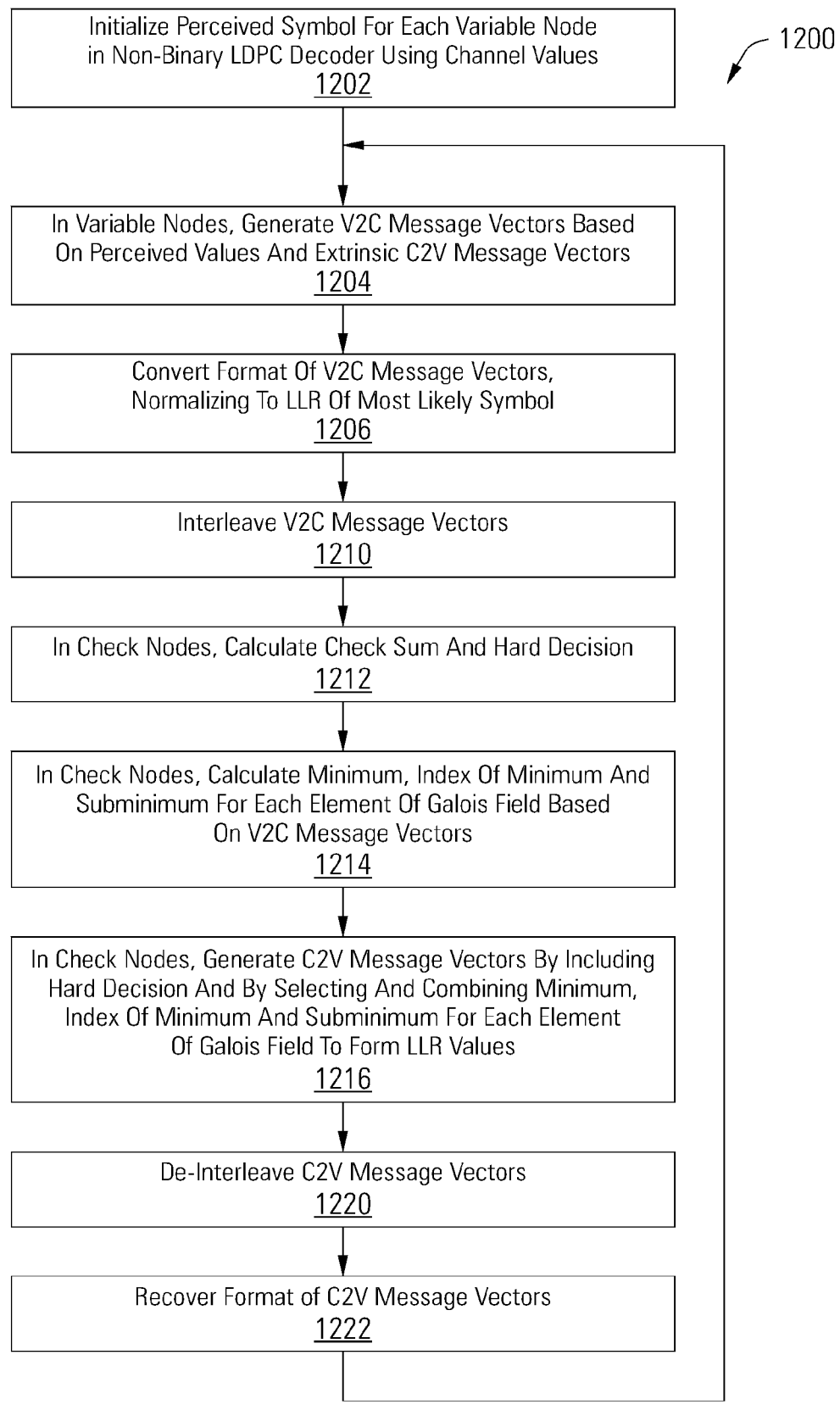
FIG. 12 depicts a flow diagram showing a method for min-sum based non-binary LDPC decoding in accordance with various embodiments of the present invention.

Turning now to FIG. 12, a flow diagram 1200 depicts a method for min-sum based non-binary LDPC decoding in accordance with some embodiments of the present invention. The method of FIG. 12, or variations thereof, may be performed in data decoding circuits such as those illustrated in FIGS. 2A-11. Following flow diagram 1200, the perceived symbol is initialized for each variable node in a min-sum based non-binary LDPC decoder using channel values. (Block 1202) V2C message vectors are generated for variable nodes based on perceived values and extrinsic C2V message vectors. (Block 1204) In some embodiments, the format of the V2C message vectors is converted, normalizing LLR values to the LLR of the most likely symbol. (Block 1206) The format conversion may convert from Format I to Format II message vectors as described above, indicating the most likely symbol in the Galois Field and the LLR values of the other field elements in Format II. The V2C message vectors are interleaved in some embodiments in an edge interleaver. (Block 1210) A check sum and hard decision is calculated for each check node. (Block 1212) The Minimum, Index Of Minimum And Subminimum is also calculated in each check node for each element of the Galois Field based on extrinsic V2C message vectors. (Block 1214) C2V message vectors are generated for each check node by include the hard decision and by selecting and combining minimum, index of minimum and subminimum values for each element of the Galois Field to form LLR values. (Block 1216) In some embodiments, the C2V message vectors are de-interleaved to reverse the interleaving of block 1210. (Block 1220) The format of the C2V message vectors is recovered in some embodiments, reversing the format conversion of block 1206. (Block 1222) Iterations continue with message vectors generated and passed between variable nodes and check nodes until values converge or until a limit on local iterations is reached.

The min-sum based non-binary LDPC decoder 400 of FIG. 4, and in particular the check node processor 404, are adapted for use with Galois Fields having a variety of different numbers of elements. In some embodiments, the check node processor is adapted to Galois Fields of particular sizes. In one example embodiment, a check node processor is adapted to a Galois Field GF(4) with four elements or symbols. In this particular embodiment, the GF(4) includes two bit elements 00, 01, 10 and 11, representing symbols 0, 1 x and x+1, respectively. The check node processor in a min-sum based non-binary LDPC decoder may be customized for GF(4) by replacing the select and combine circuit 454 in the check node processor 404 of FIG. 4 with a customized embodiment. Although the check node processor 404 of FIGS. 4-11 is operable for GF(4), by customizing the select and combine circuit in a check node processor for GF(4) specifically, circuit complexity may be reduced and decoding may be more efficient.

Figure 13:
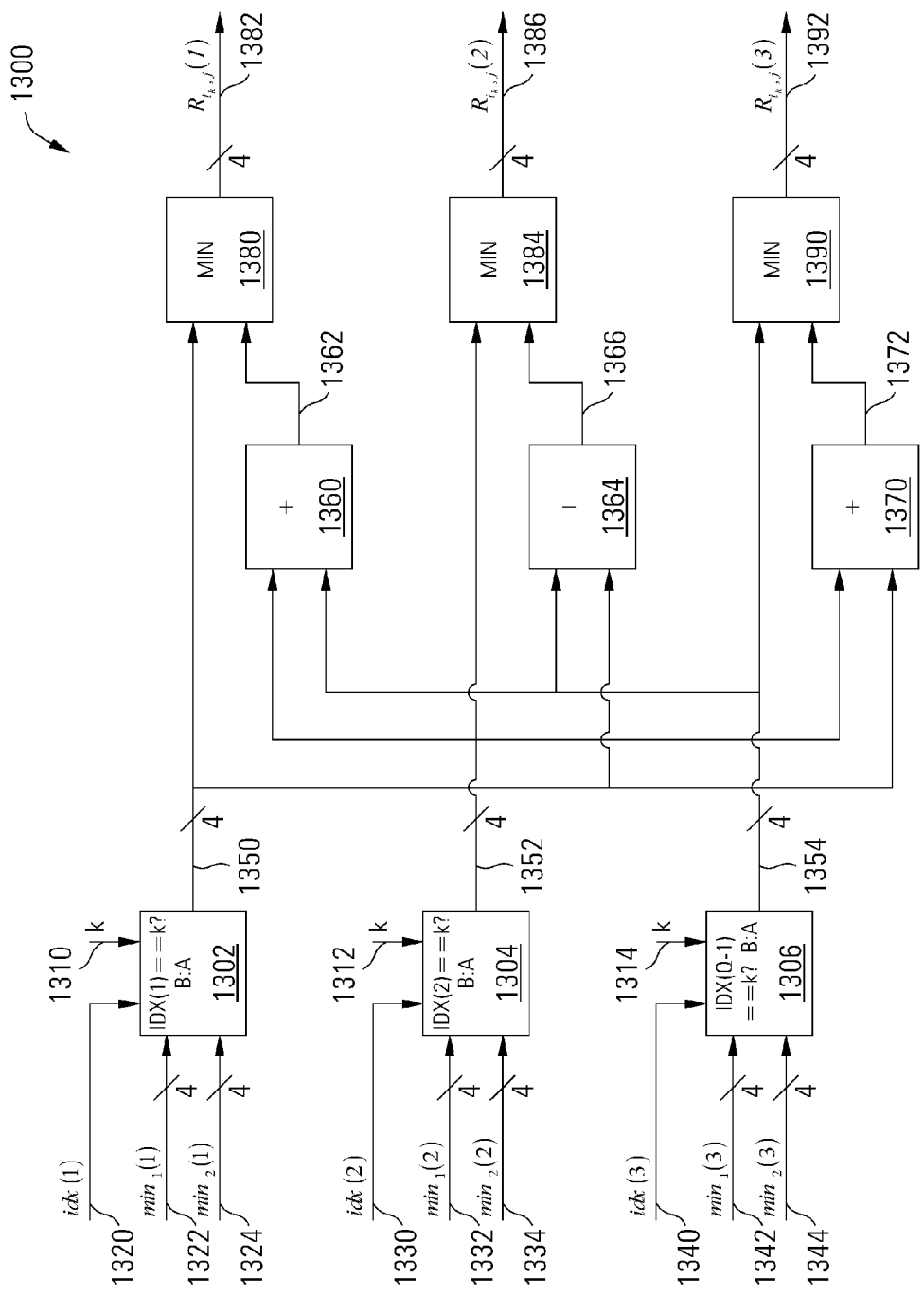
FIG. 13 depicts a select and combine circuit suitable for use in a GF(4) check node processor in a min-sum based non-binary LDPC decoder in accordance with various embodiments of the present invention.

Turning to FIG. 13, an example of a select and combine circuit 1300 is illustrated that is suitable for use as the select and combine circuit 454 of FIG. 4 given a Galois Field GF(4). The select and combine circuit 1300 processes inputs representing the minimum and sub-minimum LLR values for each of the Galois Field elements other than the most likely symbol. For the GF(4) embodiment of FIG. 13, the select and combine circuit 1300 therefore processes three sets of minimum and sub-minimum LLR values. As disclosed above, the minimum and sub-minimum LLR value for a particular Galois Field element is selected from all sub-messages for that Galois Field element from the neighboring variable nodes, and an index value is preserved identifying the variable node from which the minimum was selected. (The sub-minimum will be from a different variable node.) The select and combine circuit 1300 participates in generating C2V messages for each neighboring variable node, and thus a variable k cycles through each of the neighboring variable nodes to generate the C2V message for each. For values of k from 1 to $\rho_i$ with $j_k=N_i(k)$, the approximation messages are calculated in the select and combine circuit 1300, selecting $\min_1(d)$ if $k \neq idx(d)$ and $\min_2(d)$ if $k=idx(d)$ with the goal of avoiding messages from current variable nodes.

The selection is performed in a group of 3 selector circuits 1302, 1304, 1306, controlled by index inputs 1310, 1312, 1314 cycling through the values of k. The first selector circuit 1302 has an idx(1) input 1320, a $\min_1(1)$ input 1322 and a $\min_2(1)$ input 1324, the second selector circuit 1304 has an idx(2) input 1330, a $\min_1(2)$ input 1332 and a $\min_2(2)$ input 1334, and the third selector circuit 1306 has an idx(3) input 1340, a $\min_1(3)$ input 1342 and a $\min_2(3)$ input 1344. The three selector circuits 1302, 1304, 1306 produce three outputs 1350, 1352, 1354. Thus, outputs 1350, 1352, 1354 are set to $\min_1(d)$ if $k \neq idx(d)$ and to $\min_2(d)$ if $k=idx(d)$. This selection operation may also be represented by the pseudocode statement select idx==k?B:A, where A and B are minimum and sub-minimum LLR values for a particular Galois Field element (e.g., 1322 and 1324), idx is the input identifying the variable node that provided the minimum and sub-minimum LLR values (e.g., 1320), and k is a variable that cycles through each variable node (e.g., 1310). Outputs 1350, 1352 and 1354 thus provide the minimum input, unless the k value is the same as the idx value, indicating that the minimum input came from the same variable node for which the C2V message is being generated, in which case the sub-minimum from another variable node is provided. Thus, only extrinsic inputs are used in the generation of a C2V message, avoiding V2C messages from current variable nodes. The selector circuits 1302, 1304, 1306 are thus operable to select between a stored minimum and subminimum value (e.g., 1322, 1324) from the output of the min finder (e.g., 456) for each Galois Field element other than the most likely to yield an extrinsic input for each of the plurality of Galois Field elements (e.g., 1350).

Selector outputs 1352 and 1354 are added in adder 1360 to yield sum output 1362. Selector outputs 1350 and 1354 are added in adder 1364 to yield sum output 1366. Selector outputs 1350 and 1352 are added in adder 1370 to yield sum output 1372. Selector output 1350 and sum output 1362 are compared in comparator 1380 which yields the minimum of selector output 1350 and the sum of the other selector outputs 1352 and 1354 as output $R_{i_k,j}(1)$ 1382. Each of the outputs (e.g., 1382) is thus a lesser of a corresponding extrinsic input (e.g., 1350) and a sum (e.g., 1362) of non-corresponding extrinsic inputs (e.g., 1352, 1354).

Selector output 1352 and sum output 1366 are compared in comparator 1384 which yields the minimum of selector output 1352 and the sum of the other selector outputs 1350 and 1354 as output $R_{i_k,j}(2)$ 1386. Selector output 1354 and sum output 1372 are compared in comparator 1390 which yields the minimum of selector output 1354 and the sum of the other selector outputs 1350 and 1352 as output $R_{i_k,j}(3)$ 1392. An XOR circuit such as XOR circuit 984 of FIG. 9 is used to combine the symbol portion of the message vector in a bitwise operation, XORing the parity symbol $P_i$ with the most likely symbol $Q_{i_k,j}{}^*$ to yield hard decision $R_{i,j}{}^*$. Again, this XOR circuit implements Equation 9 above, and this function may be included either in hard decision and parity memory circuit 450 or in select and combine circuit 1300 or elsewhere in the min-sum based non-binary LDPC decoder. The resulting $R_{i,j_k}{}^*$ in combination with the three LLR values $R_{i_k,j}(d)$ 1382, 1386 and 1392 form a C2V message vector.

The min-sum based non-binary LDPC decoder disclosed herein provides a number of benefits. Updating $\min_1(d)$, idx(d) and $\min_2(d)$ has low latency. Normalization and computation of approximation messages in the select and combine circuit of a check node processor has moderate latency which is unrelated to p. The check node message computation depends on low-latency Equations 10, 11 and 12. Only $\min_1(d)$, idx(d) and $\min_2(d)$ are stored, reducing memory requirements and area. Compared to $q^2$ additions and comparisons in each step of conventional check node processing, the min-sum based non-binary LDPC decoder disclosed herein reduces them in each basic step to about one half of $q^2$ in Equation 13 and to about one fourth in Equation 15 without requiring a sorting circuit. Because the number of basic steps does not grow with ρ, and ρ check node message vectors are computed individually, the architecture is even more attractive for high-rate codes with a large row weight ρ.

Figure 14:
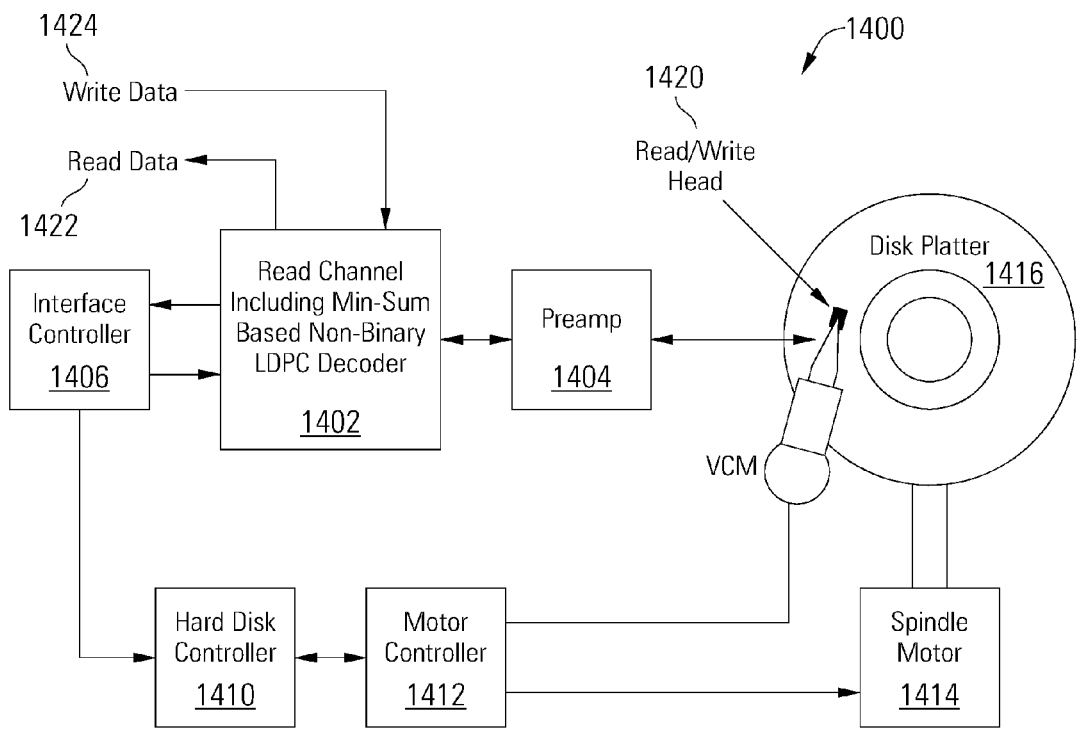
FIG. 14 depicts a storage system including a read channel circuit with a min-sum based non-binary LDPC decoder in accordance with some embodiments of the present invention.

FIG. 14 shows a storage system 1400 including a read channel circuit 1402 with a min-sum based non-binary LDPC decoder in accordance with some embodiments of the present invention. Storage system 1400 may be, for example, a hard disk drive. Storage system 1400 also includes a preamplifier 1404, an interface controller 1406, a hard disk controller 1410, a motor controller 1412, a spindle motor 1414, a disk platter 1416, and a read/write head assembly 1420. Interface controller 1406 controls addressing and timing of data to/from disk platter 1416. The data on disk platter 1416 consists of groups of magnetic signals that may be detected by read/write head assembly 1420 when the assembly is properly positioned over disk platter 1416. In one embodiment, disk platter 1416 includes magnetic signals recorded in accordance with either a longitudinal or a perpendicular recording scheme.

In a typical read operation, read/write head assembly 1420 is accurately positioned by motor controller 1412 over a desired data track on disk platter 1416. Motor controller 1412 both positions read/write head assembly 1420 in relation to disk platter 1416 and drives spindle motor 1414 by moving read/write head assembly 1420 to the proper data track on disk platter 1416 under the direction of hard disk controller 1410. Spindle motor 1414 spins disk platter 1416 at a determined spin rate (RPMs). Once read/write head assembly 1420 is positioned adjacent the proper data track, magnetic signals representing data on disk platter 1416 are sensed by read/write head assembly 1420 as disk platter 1416 is rotated by spindle motor 1414. The sensed magnetic signals are provided as a continuous, minute analog signal representative of the magnetic data on disk platter 1416. This minute analog signal is transferred from read/write head assembly 1420 to read channel circuit 1402 via preamplifier 1404. Preamplifier 1404 is operable to amplify the minute analog signals accessed from disk platter 1416. In turn, read channel circuit 1402 decodes and digitizes the received analog signal to recreate the information originally written to disk platter 1416. This data is provided as read data 1422 to a receiving circuit. As part of decoding the received information, read channel circuit 1402 processes the received signal using a min-sum based non-binary LDPC decoder. Such a min-sum based non-binary LDPC decoder may be implemented consistent with that described above in relation to FIGS. 2A-11 and 13. In some cases, the min-sum based non-binary LDPC decoding may be done consistent with the flow diagram discussed above in relation to FIG. 12. A write operation is substantially the opposite of the preceding read operation with write data 1424 being provided to read channel circuit 1402. This data is then encoded and written to disk platter 1416.

It should be noted that storage system 1400 may be integrated into a larger storage system such as, for example, a RAID (redundant array of inexpensive disks or redundant array of independent disks) based storage system. It should also be noted that various functions or blocks of storage system 1400 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for min-sum based decoding of non-binary low density parity check (LDPC) codes. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A non-binary low density parity check data decoder comprising:
   a variable node processor, wherein the variable node processor is operable to generate variable node to check node message vectors and to calculate perceived values based on check node to variable node message vectors; and
   a check node processor, wherein the check node processor is operable to generate the check node to variable node message vectors and to calculate checksums based on variable node to check node message vectors, the check node processor comprising:
      a minimum and subminimum finder circuit operable to process a plurality of sub-messages in each of a plurality of variable node to check node message vectors; and
      a select and combine circuit operable to combine an output of the minimum and subminimum finder circuit to generate the check node to variable node message vectors.

2. The decoder of claim 1, further comprising a format conversion circuit operable to convert a format of the variable node to check node message vectors from a first format to a second format.

3. The decoder of claim 2, further comprising a format recovery circuit operable to convert a format of the check node to variable node message vectors from the second format to the first format.

4. The decoder of claim 2, wherein the first format comprises a log likelihood ratio indicating a likelihood of a symbol being each of a plurality of elements in a Galois Field, and wherein the second format comprises an indication of which of the plurality of elements in the Galois Field the symbol is most likely to be, and a log likelihood ratio value for each of the other elements in the Galois Field.

5. The decoder of claim 1, further comprising an edge interleaver operable to interleave the variable node to check node message vectors, and an edge de-interleaver operable to de-interleave the check node to variable node message vectors.

6. The decoder of claim 1, wherein the check node to variable node message vectors comprise a most likely symbol in a Galois Field and a plurality of log likelihood ratio values for symbols in the Galois Field other than the most likely symbol.

7. The decoder of claim 6, wherein the plurality of log likelihood ratio values are normalized to a log likelihood ratio value of the most likely symbol.

8. The decoder of claim 1, wherein the perceived values may take any of a plurality of values from elements of a Galois Field, and wherein each of the elements of the Galois Field is represented by one of the plurality of sub-messages in each of the plurality of variable node to check node message vectors.

9. The decoder of claim 8, wherein the minimum and subminimum finder circuit is operable to identify a minimum log likelihood ratio, an index of the minimum log likelihood ratio, and a sub-minimum log likelihood ratio for each of the elements of the Galois Field from each of the plurality of variable node to check node message vectors.

10. The decoder of claim 1, wherein the check node processor further comprises a hard decision and parity check circuit operable to recursively calculate a parity check and hard decision for each of the plurality of variable node to check node message vectors.

11. The decoder of claim 1, wherein the select and combine circuit comprises an update table generator, and wherein the select and combine circuit is operable to combine the output of the minimum and sub-minimum finder circuit to generate the check node to variable node message vectors based at least in part on an output of the update table generator.

12. The decoder of claim 1, wherein the select and combine circuit is operable to select between values in the output of the minimum and subminimum finder circuit to include only values from extrinsic variable node to check node message vectors when generating each of the check node to variable node message vectors.

13. The decoder of claim 12, wherein the select and combine circuit is further operable to select between a stored minimum and subminimum value from the output of the minimum and subminimum finder circuit for each of a plurality of Galois Field elements to yield an extrinsic input for each of the plurality of Galois Field elements, wherein the output of the minimum and subminimum finder circuit comprises a signal for each of the plurality of Galois Field elements, and wherein each of the signals comprises a lesser of a corresponding extrinsic input and a sum of non-corresponding extrinsic inputs.

14. The decoder of claim 1, wherein the system is implemented as an integrated circuit.

15. The decoder of claim 1, wherein the system is incorporated in a storage device.

16. The decoder of claim 15, wherein the storage device comprises:
   a storage medium maintaining a data set; and
   a read/write head assembly operable to sense the data set on the storage medium and to provide an analog output corresponding to the data set, wherein the variable node processor is operable to receive a signal derived from the analog output.

17. The decoder of claim 1, wherein the system is incorporated in a data transmission device.

18. A method for decoding non-binary low density parity check encoded data, the method comprising:
   generating a variable node to check node message vector in a variable node processor based at least in part on a plurality of check node to variable node message vectors;
   calculating a check sum and hard decision in a check node processor in a check node processor based at least in part on a plurality of variable node to check node message vectors;
   calculating a minimum, index of minimum and sub-minimum value in the check node processor for each element in a Galois Field from each of the plurality of variable node to check node message vectors; and
   generating a check node to variable node message vector in the check node processor by combining the minimum, index of minimum and sub-minimum values.

19. The method of claim 18, further comprising converting the variable node to check node message vector from a first format to a second format, and converting the check node to variable node message vector from the second format to the first format.

20. The method of claim 19, wherein the first format comprises a log likelihood ratio indicating a likelihood of a symbol being each of the elements in the Galois Field, and wherein the second format comprises an indication of which element in the Galois Field the symbol is most likely to be, and a log likelihood ratio value for each of the other elements in the Galois Field.

21. The method of claim 18, further comprising interleaving a plurality of variable node to check node message vectors and de-interleaving a plurality of check node to variable node message vectors.

22. The method of claim 18, wherein generating a check node to variable node message vector comprises indicating a most likely element in the Galois Field and a log likelihood ratio value for remaining elements in the Galois Field, wherein the log likelihood ratio values for the remaining elements are normalized to a log likelihood ratio value of the most likely element in the Galois Field.

23. A data decoding circuit, the circuit comprising:
a variable node processor, wherein the variable node processor is operable to generate variable node to check node message vectors and to calculate perceived values based on check node to variable node message vectors, and wherein the perceived values may take any of a plurality of values from elements of a Galois Field; and
a check node processor, wherein the check node processor is operable to generate the check node to variable node message vectors and to calculate checksums based on variable node to check node message vectors, the check node processor comprising:
a minimum and subminimum finder circuit operable to process a plurality of sub-messages in each of a plurality of variable node to check node message vectors, wherein each of the elements of the Galois Field is represented by one of the plurality of sub-messages in each of the plurality of variable node to check node message vectors, wherein the minimum and subminimum finder circuit is operable to identify a minimum log likelihood ratio, an index of the minimum log likelihood ratio, and a sub-minimum log likelihood ratio for each of the elements of the Galois Field from each of the plurality of variable node to check node message vectors; and
a select and combine circuit operable to combine an output of the minimum and subminimum finder circuit to generate the check node to variable node message vectors.

24. The circuit of claim 23, wherein the circuit is incorporated in a storage device having a storage medium maintaining a data set and a read/write head assembly operable to sense the data set on the storage medium and to provide an analog output corresponding to the data set, wherein the variable node processor is operable to receive a signal derived from the analog output.

* * * * *